United States Patent [19]
Yoshimura et al.

[11] 4,095,253
[45] June 13, 1978

[54] SINGLE IN-LINE HIGH POWER RESIN-PACKAGED SEMICONDUCTOR DEVICE HAVING AN IMPROVED HEAT DISSIPATOR

[75] Inventors: Masayoshi Yoshimura, Tokyo; Keizo Otsuki, Higashiyamato; Senji Shoji, Tokorozawa; Tomio Yamada; Ichio Shimizu, both of Kodaira; Yuji Arai, Kokubunji, all of Japan

[73] Assignee: Hitachi, Ltd., Japan

[21] Appl. No.: 744,397

[22] Filed: Nov. 23, 1976

[30] Foreign Application Priority Data

Nov. 29, 1975 Japan .................................. 50-142794

[51] Int. Cl.² .................. H01L 23/38; H01L 23/42; H01L 23/44
[52] U.S. Cl. ........................................ 357/81; 357/72; 357/79; 174/16 HS; 165/80
[58] Field of Search ................. 357/72, 74, 79, 81; 174/16 HS; 165/80, 105

[56] References Cited

U.S. PATENT DOCUMENTS

| 2,955,242 | 10/1960 | Darziale | 357/74 |
| 3,548,927 | 12/1970 | Spurling | 357/81 |
| 3,606,673 | 9/1971 | Overman | 357/72 |
| 3,694,703 | 9/1972 | Wilens et al. | 357/81 |
| 3,786,317 | 1/1974 | Thierfelder | 357/81 |
| 3,893,161 | 7/1975 | Pesak | 357/81 |

FOREIGN PATENT DOCUMENTS 1,334,173  10/1973  United Kingdom .................. 357/81

Primary Examiner—Andrew J. James
Attorney, Agent, or Firm—Craig & Antonelli

[57] ABSTRACT

A single in-line, high power, resin-packaged semiconductor device having a plurality of external leads disposed in parallel to each other and projecting from one side surface of a resin-molded package, wherein a heat sink fin mounting plate is formed in unitary structure with a plate for carrying a semiconductor pellet and arranged to project from a recessed portion of the opposite side surface of the resin-molded package and a heat sink fin has one end bent in U-shape and caulked on the fin mounting plate and the remaining portion overlapping one principal surface of the resin-molded package. The projection of the heat sink fin from the resin-molded package can be reduced to enable the device to be assembled in compact electronic instruments or devices. Heat dissipation efficiency can also be improved by mounting the semiconductor device on a chassis with the heat sink fin brought in contact with the chassis.

17 Claims, 17 Drawing Figures

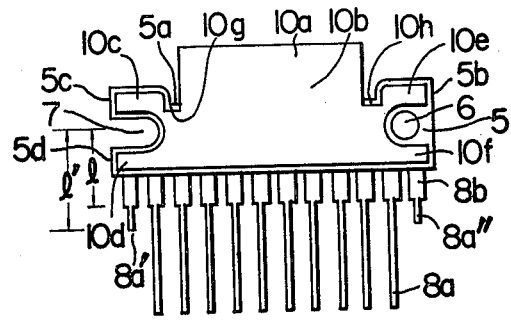
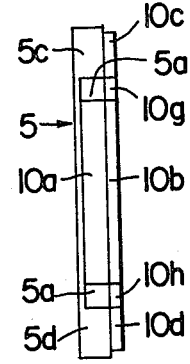
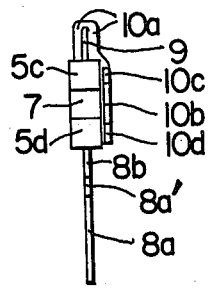
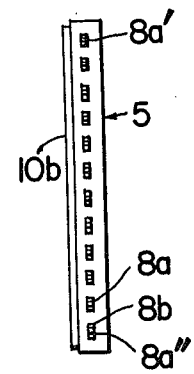
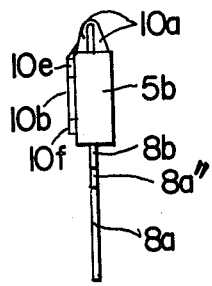

SINGLE IN-LINE HIGH POWER RESIN-PACKAGED SEMICONDUCTOR DEVICE HAVING AN IMPROVED HEAT DISSIPATOR

BACKGROUND OF THE INVENTION

Field of the Invention

This invention relates to a resin-packaged semiconductor device and more particularly to improvement in high-power, resin-packaged semiconductor integrated circuits having a plurality of external leads.

2. Description of the Prior Art

In resin-packaged semiconductor integrated circuit (IC) devices, a number of external leads are usually derived in parallel to each other to project from one side surface (single in-line) or from the opposing two side surfaces (dual in-line) of the resin package.

An example of a conventional single in-line resin-packaged, high power, semiconductor IC device is shown in FIGS. 1A to 1C, which is sold under the tradenames of NEC μPC1020H and SANYO A4400 (is similar to one disclosed in Japanese Utility Model Publication No. 51-37420). FIG. 1A shows a perspective view, FIG. 1B a cross-section along the line 1B—1B in FIG. 1A, and FIG. 1C how the semiconductor IC device of FIGS. 1A and 1B is mounted on a chassis and connected to a printed circuit board. In the figures, numeral 1 denotes a resin package, for example of epoxy resin, 2 a plurality of external leads, each having an elongated narrower portion 2a and a wider portion 2b, 3 a heat sink or dissipation fin projecting from the side surface opposite to that from which the leads 2 project, and 4 bolt apertures formed in the heat sink fin for mounting the IC device to a chassis in an electronic instrument or device. Although the interior of the resin package is not shown, an IC pellet is carried at the pellet mounting portion of the heat sink fin. A number of electrodes formed on the surface of the pellet are electrically connected to respective external leads through thin metal wires, e.g., gold wires. The wider portions of the external leads extend to the neighborhood of the pellet carrying portion of the heat sink fin and the gold bonding is made on the ends thereof.

Such IC devices are assembled in electronic devices such as car stereophonic devices together with other discrete electronic components such as transistors, capacitors, resistors, etc. An example of the positional relation of the assembly is shown in FIG. 1C. The elongated portions 2a of the external leads are inserted into the apertures formed in a printed circuit board of the electronic device until the wider portions 2b of the external leads contact with the surface of the printed circuit board and soldered to the leads 43 on the printed circuit board similar to other electronic components 41. On the other hand, the heat sink fin 3 is bent as shown in the figure and attached to a chassis 44 of the electronic device with bolts 45 utilizing the bolt apertures 4.

In the conventional high power, resin-packaged IC device as shown in FIG. 1, however, the length or height h of the heat sink fin 3 is designed as large as possible for increasing the heat dissipation efficiency. Such a high heat sink fin makes the assembly of the IC device in an electronic device required to be compact, such as a car stereophonic device, very difficult. Further, for mounting the IC device firmly on a chassis, the resin package should be held in close contact with the chassis. Here, the heat sink fin should also be in good thermal contact with the chassis while it should be physically firmly fixed to the chassis. For attaining this purpose, the heat sink fin should be bent to bring the main portion located on the same plane as that of the resin surface as shown in FIG. 1C or a portion of the chassis for mounting the heat sink fin should be bent in a similar manner. In either case, an additional manufacturing process is required which raises the manufacturing cost.

Further, in encapsulating a semiconductor pellet in resin according to the conventional method, a pellet is placed at the pellet mounting portion of the heat sink fin and the assembly is molded in resin. Thus, the external leads are located at an off-center position in the thickness direction of the resin package. Thus, there is is no versatility in attaching the IC device to the chassis.

Yet further, since the length in the heat sink fin from the pellet carrying position to the position of contact with the chassis becomes long, there may arise thermal resistivity therebetween and the heat dissipation efficiency cannot be improved sufficiently.

SUMMARY OF THE INVENTION

Therefore, this invention is intended to solve the above drawbacks.

An object of this invention is to provide a resin-packaged semiconductor device capable of reducing the length of the heat sink fin projecting from the resin package and of providing good heat dissipation efficiency.

Another object of this invention is to provide a single in-line, high power, resin-packaged semiconductor IC device of low cost which can be easily assembled in a compact electronic device.

A further object of this invention is to provide a single in-line resin-packaged semiconductor device having a heat dissipating structure capable of reducing the thermal resistance between the semi-conductor pellet and the chassis for mounting the semiconductor device.

Another object of this invention is to provide a plastic-molded package of a semiconductor device of good operation efficiency, having a structure which enables a heat sink fin of the device to be assembled on either one of the two principal surfaces so as to enhance the assembly of the device to a chassis and a printed circuit board.

For achieving the above objects in a resin-packaged semiconductor device having a plurality of external leads disposed in parallel to each other and projecting from one side surface of the encapsulating resin package, a heat sink fin mounting plate is arranged to project from the opposite side surface to that from which the external leads project, a heat sink fin is disposed to have one end portion overlapping and connected with the heat sink fin mounting plate and the remaining portion extending on a principal surface of the resin package, thereby enabling a reduction in the height of the heat sink fin projecting from the resin package for enhancing assembly in a compact equipment. Further, since the leads and the heat sink fin are arranged to project from the center in the thickness direction of the resin package, a similar heat sink fin can be mounted on either principal surface of the resin package, thereby improving the operation efficiency of assembly or mounting.

As will become apparent from the following description on the embodiments, a recessed portion is formed in a side surface of the resin package and the heat sink fin mounting plate is disposed to project from this recessed portion. One end portion of the heat sink fin is fixed to the fin mounting plate in this recessed portion and the remaining portion of the heat sink fin is arranged to overlap either one principal surface of the resin package. Thereby, the length of the heat sink fin projecting from the resin package can be reduced to enable assembly in a compact electronic device. Further, since the contact of the heat sink fin to the chassis of the electronic device is formed at the overlapping portion of the heat sink fin on the resin package, the distance from the semiconductor pellet to the contact portion can be reduced greatly and hence the thermal resistance therebetween can be reduced to enhance the heat dissipation efficiency.

These and other objects, features and advantages of the invention will be understood from the following detailed description of the invention taken in conjunction with the accompanying drawings.

BRIEF DESCRIPTION OF THE DRAWINGS

FIGS. 1A to 1C show a conventional resin-packaged IC device; in which FIG. 1A is a perspective view, FIG. 1B is a side cross-section, and FIG. 1C is a partial cross-section showing how the IC device is assembled into a utilization device.

FIGS. 3A to 3F are a top plan view, a bottom plan view, a right side view, a left side view, an upper side view and a lower side view of the resin-packaged IC device of FIG. 2, respectively.

FIGS. 4A to 4C are plan views and FIG. 4D is a cross-section.

DESCRIPTION OF THE PREFERRED EMBODIMENTS

Figure 1A:
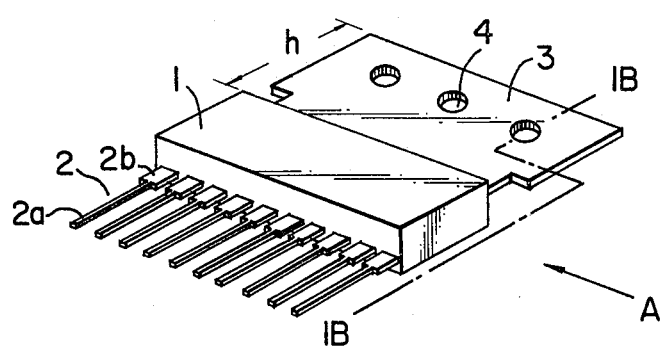
Figure 1B:
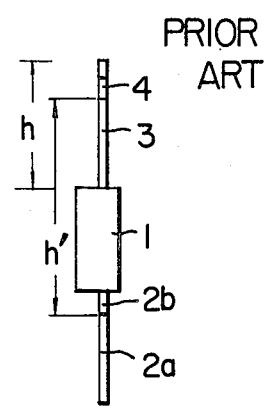
Figure 1C:
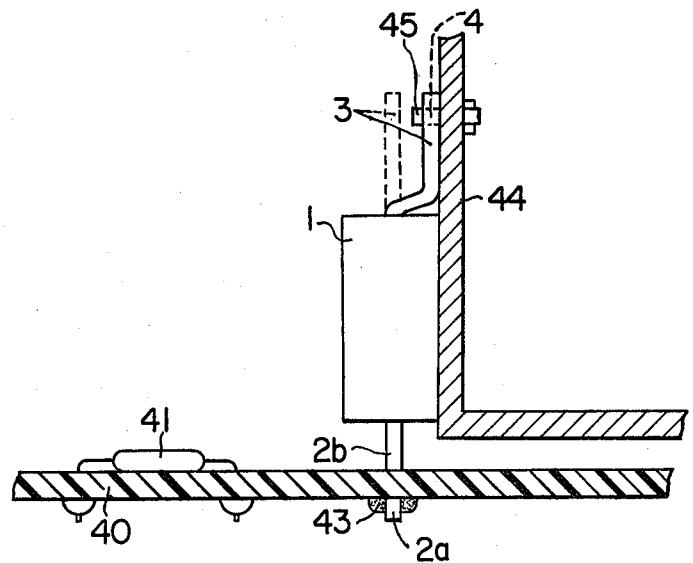
Figure 2:
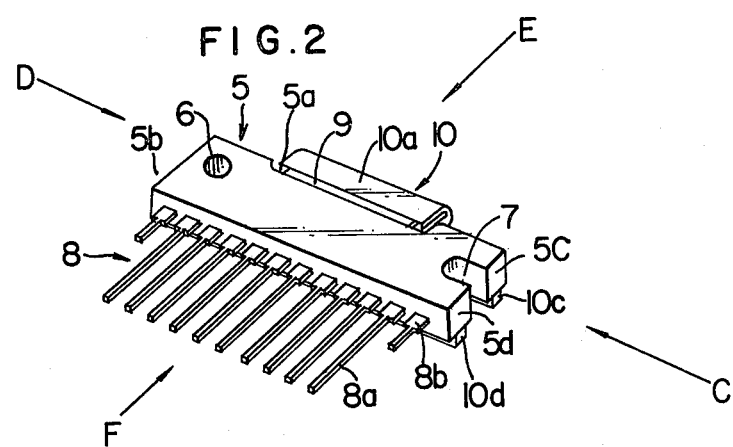
FIG. 2 is a perspective view of a resin-packaged IC device according to an embodiment of this invention.

FIG. 2 is a perspective view of a high power, resin-packaged semiconductor IC device according to an embodiment of this invention. In the figure, a protective resin mold 5, for example formed of epoxy resin, has bolt holes (or cut-away) 6 and 7 for the attachment to a chassis. A plurality of external leads 8 project from a side surface of the resin body 5 in parallel to each other, each lead having a wider stem portion 8b and an elongated narrower portion 8a. A heat sink fin mounting plate 9 projects from the opposite side surface to that provided with the external leads. The external leads 8 and the heat sink fin mounting plate 9 are formed of the same metal plate of good thermal conductivity, such as thin strip of oxygen-free copper, tin-contained oxygen-free copper, phosphor bronz, or Koval metal (trademark of Westinghouse Electric Corporation for an iron-nickel-cobalt alloy). The surface of these leads 8 and fin mounting plate 9 is coated with silver. The metal material for use in high power IC devices is preferably oxygen-free copper or tin-contained oxygen-free copper from the point of higher thermal conductivity. A heat sink fin 10 formed for example of an aluminium thin plate has one end bent in U-shape to sandwich the heat sink fin mounting plate 9 and the remaining portion 10b (FIG. 3B) overlapping substantially all the area of one principal surface of the resin package 5. The U-shaped portion of the heat sink fin 10 is pinched by pressure on the fin mounting plate 9. Such an IC device is fixed on a chassis with bolts inserted in the holes 6 and 7 to bring the main portion 10b of the heat sink fin 10 in good contact with the chassis of the electronic device directly or through an insulating member of good thermal conductivity. The provision of the insulating member is effective when electric isolation is required.

Figure 3A:
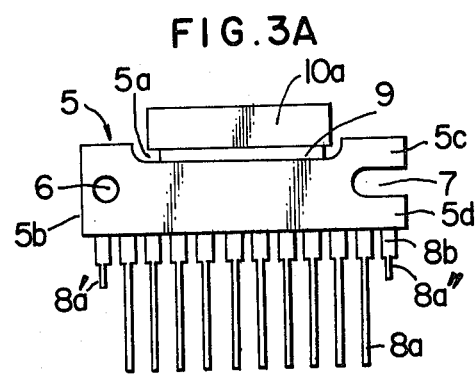

FIGS. 3A to 3F show the same IC device seen from various directions as indicated in FIG. 2. As shown in FIG. 3B, the heat sink fin 10 has U-shaped cut-away portions at both end portions corresponding to the mounting bolt holes 6 and 7. Further, the external leads 8 and the heat sink fin mounting plate 9 are arranged to project from the center of the side surfaces in the thickness direction of the resin package 5, as shown in FIGS. 3C and 3D. The side surface from which the fin mounting plate 9 projects has a recessed shape and the heat sink fin mounting plate 9 projects from this recessed portion 5a. At the recessed portion, the resin mold has a thickness (in the longitudinal direction along the leads 8) sufficient to protect the pellet and the leads formed of such as gold wires. Here, simply decreasing the thickness may introduce deterioration in the humidity proof property since the linear distance from the resin surface to the pellet decreases. For preventing such deterioration, a groove or grooves 14 are formed in the heat sink fin mounting plate as will be described in connection with FIG. 4A. The heat sink fin 10 has projecting portions 10c, 10d, 10e and 10f near the mounting bolt holes 6 and 7 in correspondence to the shape of the resin portions 5c, 5d and 5b. Further, as one end portion 10a of the heat sink fin 10a is to be fixed on the heat sink fin mounting plate 9 by caulking at the recessed portion 5a, there are formed cut-away portions 10g and 10h in the heat sink fin 10 at the both ends of the recessed portion 5a corresponding to the shape of the recessed portion 5a and the fin mounting plate 9. In the conventional single in-line resin-packaged semiconductor device, the distance from the wider portion 8a of the external leads 8 to the center of the bolt holes 4 is generally fixed at a constant value h', as shown in FIG. 2A. For affording compatibility or replaceability to the present device having a smaller distance l between the wider portion 8b of the leads and the center of the mounting bolt holes 6 and 7 than the distance h' with the conventional devices, the following arrangement may be adopted. Namely, among the external leads 8 projecting from a side surface of the resin package 5 in parallel to each other, two external leads disposed at the both ends are not used electrically but cut short in the elongated narrower portions 8a' and 8a" as shown in FIG. 3B to have a distance l' from the tip of the portions 8a' and 8a" to the center of the mounting bolt holes 6 and 7 equal to the distance h' of the conventional devices. In other words, there are provided two scaling pins for correctly and firmly locating the present semiconductor IC device in place of a conventional IC device by abutting the scaling pins on a printed circuit board. It will be apparent that such scaling pins may be disposed not only at the both ends but at any position. Also, they may be formed in any shape. For example, wider pins than other leads may be used for increasing the heat dissipation.

Next, description will be made on how the IC device of FIGS. 2 and 3A to 3F is manufactured referring to FIGS. 4A to 4D.

Figure 4A:
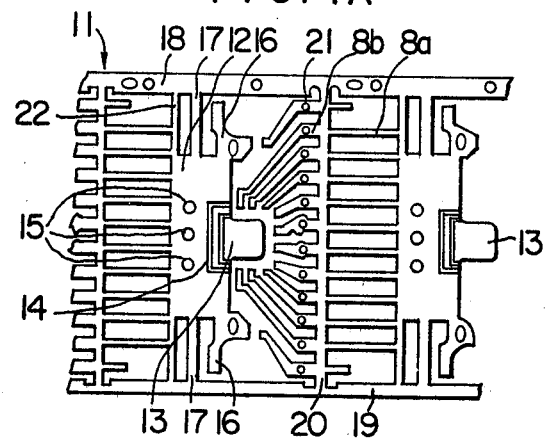
FIGS. 4A to 4D show how the resin-packaged IC device of FIG. 2 is manufactured.
Figure 4B:
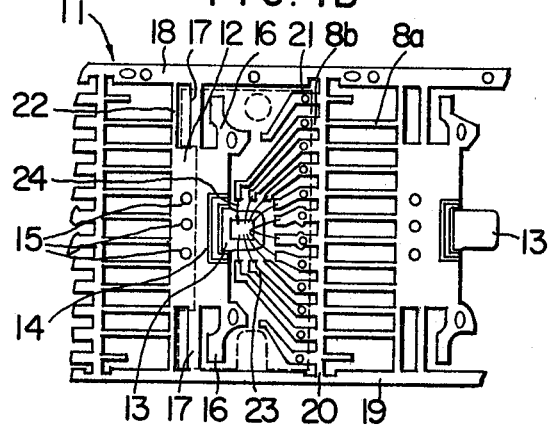

First, a metal strip formed oxygen-free copper and having a width of about 34 mm and a thickness of about 0.5 mm is prepared. A batch of lead frames 11 of a predetermined pattern is formed in the metal strip by the known pressed stamping method or the etching method, as shown in FIG. 4A. In each lead frame, numeral 12 denotes a heat sink fin mounting plate which has a pellet mounting portion 13 at one portion thereof. Around the pellet mounting portion 13, a pair of grooves 14 is formed for preventing penetration of humidity from the outside to the pellet mounting portion 13 after encapsulaing the semiconductor device in resin. Through-holes 15 are formed in the heat sink fin mounting plate for enhancing the mechanical connection of the heat sink fin 10 to the fin mounting plate 12. Here, these holes may not be circular but in any form such as square or rectangular. Also, these holes may not be aligned on a straight line, but, for example, may be arranged zig-zag. Further, in addition to such holes, a strip-shaped groove or grooves may be provided to enhance adhesion. Portions 16 project from the heat sink fin mounting plate to form reinforcing plates for the resin package at these portions. Portions 17 temporarily connect the heat sink fin mounting plate to outer frames 18 and 19. A dam lead 20 connects the plurality of external leads 8 therebetween and to the outer frames 18 and 19 and also serves to prevent the leak of resin in encapsulating the device with resin. As seen from FIG. 4B (see also FIGS. 2, 3 and 4A), each of the external leads 8 has an elongated thin portion 8a for external connection and a wider portion 8b extending from the dam lead 20 to the neighborhood of the pellet mounting portion 13. Resin is applied in the portion surrounded by the dotted broken line. A hole 21 is formed in each wider portion 8b of the lead to reinforce the mechanical strength of the encapsulating resin by filling the hole with the resin. Connector plates 22 serve to support the narrower portions of the external leads and the heat sink fin mounting plate temporarily by the outer frames 18 and 19.

After the surface of the lead frame 11 is plated with silver, an IC pellet 23 is fixed on the pellet mounting portion 13 and electrodes formed on the surface of the IC pellet are connected with gold wires 24 to the respective external leads 8 using the known nail-head bonding technique. Then the portion surrounded by the dotted broken line is sealed in resin. This sealing can be achieved by the known transfer mold technique. After the resin encapsulation, unnecessary portions such as the temporary connectors 17 and 22 and the dam lead 20 are cut away to provide each IC device. This cutting process is achieved in a lead cutter having an upper stamp and a lower stamp of a predetermined pattern by clamping the lead frame between the upper and lower stamps. Here, the mounting of the semiconductor pellet on the pellet mounting portion 13 of the lead frame 11 may be achieved by the method disclosed in copending U.S. application, Ser. No. 663,471, filed on March 3, 1976, entitled "Method of Providing Semiconductor Pellet with Heat Sink and Semiconductor Device with such Heat Sink" assigned to the same assignee of this application.

Figure 4C:
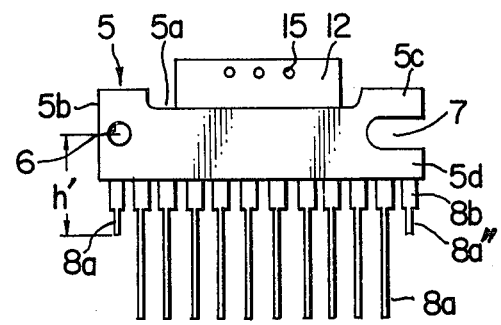

FIG. 4C shows a plan view of the IC device provided in the above manner. It is seen that resin is molded to leave the bolt holes 6 and 7.

Figure 4D:
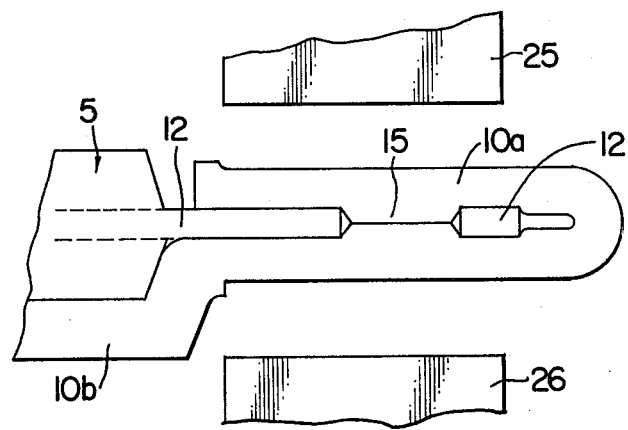

Next, a heat sink fin formed of an aluminium plate of about 1.2 mm thickness is prepared to have a shape as shown in FIGS. 3A to 3F and one end 10a preliminarily bent in U-shape to sandwich the heat sink fin mounting plate 12. The heat sink fin mounting plate 12 of the IC device as shown in FIG. 4C is inserted into the U-shape portion of the heat sink fin. Then, the heat sink fin is caulked on the fin mounting plate 12 in the overlapping portion of the fin mounting plate 12 and the U-shaped portion 10a of the heat sink fin in caulking machine having an upper and a lower molds 25 and 26 by applying a pressure of 0.65 – 7 kg/mm², as shown in FIG. 4D. The one end portion 10a of the heat sink fin is firmly fixed or attached to the fin mounting plate 12 as shown in the figure, thus the fin mounting plate securely holding the heat sink fin. In this pressure pinching process, the aluminium heat sink fin is also extruded from the both sides into the holes 15 formed in the fin mounting plate 12 to fill the space. Therefore, the adhesion of the heat sink fin 10 to the fin mounting plate 12 is further reinforced. In this embodiment, aluminium is used as the heat sink material. Besides aluminium, any material having a good thermal conductivity and a relatively low hardness such as pure copper may be used for the heat sink fin. Pure copper has better thermal conductivity than aluminium and hence is fitted for use in a very high power IC device.

Further, the heat sink fin may not be bent in U-shape at one end and caulked thereat. One end of a heat sink fin may be arranged to overlap the fin mounting plate and spot-welded or connected with an adhesive of good thermal conductivity or with silver paste or a solder thereat.

Figure 5A:
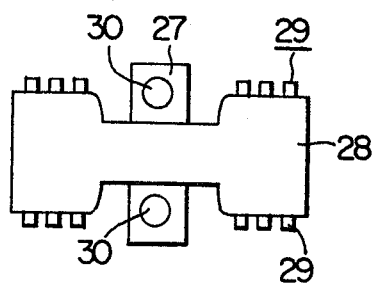
FIGS. 5A to 5C are respectively a top plan view, a side view and a bottom plan view of a dual inline resin-packaged IC device according to another embodiment of this invention.
Figure 5B:
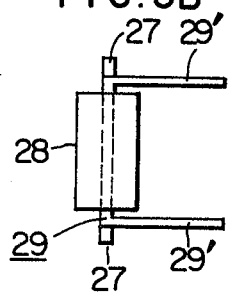
Figure 5C:
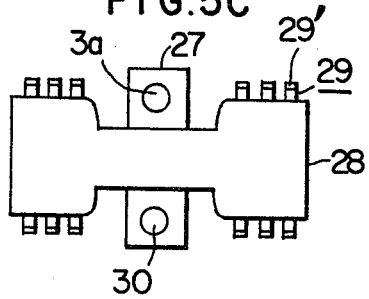

FIG. 5 shows a modification of a dual in-line, resin-molded IC package according to another embodiment of this invention in which heat sink fins 27 are disposed to project from the center of the side surfaces of a resin mold 28 having recesses. External leads 29 are bent downward, numeral 29' showing the bent portions. Bolt holes 30 are formed in the heat sink fins 27 for mounting the IC package to a chassis of a utilization equipment. Since the side surfaces of the resin package are recessed, the total width of the IC package can be reduced while keeping good heat dissipation efficiency.

As has been described above, since the heat sink fin and the external leads are disposed to project from the center position in the thickness direction of the side surface of the resin mold, the heat sink fin can be mounted on either principal surface of the resin mold. Since the IC devices having the heat sink fin mounted on the opposite principal surface have symmetrical shapes (mirror images), in assembling the present semiconductor device to a chassis, the heat sink fin can be mounted on a preferable surface in accordance with the positional relation of the external leads in the circuit.

Further, since dam leads are provided to adjust the distance from the mounting bolt holes to the printed circuit board, there is afforded compatibility or replaceability with the conventional devices.

What is claimed is:

1. A resin-packaged semiconductor device having a resin-molded package defined by a plurality of principal surfaces interconnected by a plurality of side surfaces, a plurality of external leads projecting in parallel to each other from one side surface of said resin-molded package, comprising:

a heat sink fin mounting plate projecting from a side surface of the resin-molded package opposite to said one side surface from which said external leads project; and a heat sink fin having one end portion overlapping said heat sink fin mounting plate and the remaining portion extending from said fin mounting plate into overlapping contact with substantially the entire area of at least one of said plurality of principal surfaces of said resin-molded package, said one end portion of the heat sink fin being connected in close contact with said heat sink fin mounting plate.

2. A resin-packaged semiconductor device according to claim 1, wherein said one end portion of the heat sink fin is bent in U-shaped form and said heat sink fin mounting plate securely holds the heat sink fin at said U-shaped portion.

3. A resin-packaged semiconductor device according to claim 1, wherein said opposite side surface of the resin-molded package from which said heat sink fin mounting plate projects has a recessed portion, and said heat sink fin mounting plate projects from said recessed portion of said opposite side surface.

4. A resin-packaged semiconductor device according to claim 2, wherein said opposite side surface of the resin-molded package from which said heat sink fin mounting plate projects has a recessed portion, and said heat sink fin mounting plate projects from said recessed portion of said opposite side surface.

5. A resin-packaged semiconductor device according to claim 1, wherein said external leads and said heat sink fin mounting plate are formed of the same metal member, disposed on a common plane and project from the opposing side surfaces of the resin-molded package at the center in the thickness direction of the resin molded package.

6. A resin-packaged semiconductor device according to claim 4, further comprising holes for mounting said semiconductor device, formed through said resin-molded package and said heat sink fin overlapping thereon at the both ends thereof in the direction perpendicular to the external leads.

7. A resin-packaged semiconductor device according to claim 6, wherein said remaining portion of said heat sink fin which extends from said fin mounting plate and makes contact with substantially all the area of at least one principal surface of said resin molded package forms a surface for mounting said semiconductor device to an electronic device.

8. A resin-packaged semiconductor device according to claim 6, wherein said heat sink fin is formed of a soft material of high thermal conductivity.

9. A single, in-line, high power, resin-packaged semiconductor integrated circuit device having a resin-molded package defined by a plurality of principal surface interconnected by a plurality of side surfaces, a plurality of external leads projecting in parallel to each other from one side surface of said resinmolded package, comprising:
the resin molded package having part of another side surface opposite to said one side surface recessed;
a plate for carrying a semiconductor circuit pellet thereon;
a heat sink fin mounting plate of high thermal conductance disposed in the same plane as said leads, formed unitary with said pellet carrying plate and having a portion thereof extending from said recessed side surface of the resin-molded package; and
a plate-shaped heat sink fin having a portion adhered to the extended portion of said fin mounting plate and fixed thereto and the remaining portion of said heat sink fin extending therefrom and overlapping substantially all the area of one principal surface of said package in close contact therewith, the remaining portion of said heat sink fin overlapping the one principal surface of the package serving as the mounting surface of the circuit device.

10. A single in-line, high power, resin-packaged semiconductor integrated circuit device according to claim 9, further comprising holes for mounting said circuit device, formed through said resin-molded package and said heat sink fin overlapping thereon at both ends thereof in the direction perpendicular to said external leads.

11. A resin-packaged semiconductor device according to claim 3, further comprising:
means for preventing penetration of humidity into a pellet mounting portion of the resin-molded package including groove means formed in said heat sink fin mounting plate about said pellet portion.

12. A single in-line, high power, resin-packaged semiconductor integrated circuit device according to claim 9, further comprising:
means for preventing penetration of humidity into a pellet mounting portion of the resin-molded package including groove means formed in said heat sink mounting plate about said pellet portion.

13. A resin-packaged semiconductor device according to claim 1, wherein the connection between said heat sink fin mounting plate and said heat sink fin is formed by bonding.

14. A resin-packaged semiconductor device according to claim 12, wherein said bonding is formed by adhesive and said heat sink fin mounting plate is provided with aperture means for facilitating the bonding of said heat sink fin to said heat sink fin mounting plate.

15. A resin-packaged semiconductor device according to claim 1, wherein scaling pin means for correctly and firmly locating the semiconductor device with respect to a mounting board is provided on said one side surface of said resin-molded package.

16. A resin-packaged semiconductor device having an improved heat dissipator and a plurality of external leads projecting in parallel to each other from the surface of a first side of a resin-molded package, comprising:
a heat sink fin mounting plate projecting from a side surface of a second side of the resin-molded package opposite to said first side; and
a heat sink fin having one end portion overlapping said heat sink fin mounting plate and the remaining portion extending from said fin mounting plate and overlapping said resin-molded package, said one end portion of the heat sink fin being bent over the end of said mounting plate and nonreleasable means attaching said bent over portion to said heat sink fin mounting plate, said remaining portion making contact with substantially all the area of at least one principal surface of said resin-molded package.

17. A resin-packaged semiconductor according to claim 15, wherein said package includes third and fourth sides disposed between said first and second sides, respectively and wherein said second side includes a substantially flat central surface offset inwardly from the rest of said second side and extending from said third side to said fourth side, said heat sink fin mounting plate extending outwardly from said flat central surface of said package.

* * * * *